United States Patent [19]
Lee

[11] Patent Number: 6,021,672
[45] Date of Patent: Feb. 8, 2000

[54] SIMULTANEOUS IN-SITU OPTICAL SENSING OF PRESSURE AND ETCH RATE IN PLASMA ETCH CHAMBER

[75] Inventor: Szetsen Steven Lee, Hsinchu, Taiwan

[73] Assignee: Windbond Electronics Corp.

[21] Appl. No.: 09/156,581

[22] Filed: Sep. 18, 1998

[51] Int. Cl.[7] .................................................. G01L 7/00
[52] U.S. Cl. ............................................................ 73/714
[58] Field of Search .......................... 73/700, 714, 705; 118/723 I; 156/345; 204/298.41; 216/59, 60, 61, 67, 68, 79

[56] References Cited

U.S. PATENT DOCUMENTS

| | | | |
|---|---|---|---|
| 5,458,754 | 10/1995 | Sathrum et al. | 204/298.41 |
| 5,474,650 | 12/1995 | Kumihashi et al. | 216/67 |
| 5,571,366 | 11/1996 | Ishii et al. | 156/345 |

*Primary Examiner*—William Oen
*Attorney, Agent, or Firm*—W. Wayne Liauh

[57] ABSTRACT

A non-intrusive method for in-situ measurement of etching chamber and optionally etch rate inside a plasma etching chamber is disclosed for use in the fabrication of semiconductor devices. The method includes the step of selecting at least one plasma species as a probe which can be F, $CF_2$, or CO, then measuring the emission intensity at a predetermined wavelength corresponding to the plasma species so selected. Preferably, the emission intensity is measured at wavelength of 686 nm (corresponding to the transition of F from $3s^3P_3$ to $3p^4P_3$), 269 or 239 nm, corresponding to the transitions from $A^1B_1(v'=0)$ to $X^1A_1(v''=0)$ and from $A^1B_1(v'=9)$ to $X^1A_1(v''=0)$ for $CF_2$, respectively, and 693 or 505 nm, corresponding to the transitions from $d^3\Pi(v'=2)$ to $a^3\Pi(v''=2)$ and from $d^3\Pi(v'=7)$ to $a^3\Pi(v''=2)$ for CO, respectively. By properly selecting the measurement site, etching rate and etching pressure can be obtained simultaneously.

18 Claims, 4 Drawing Sheets

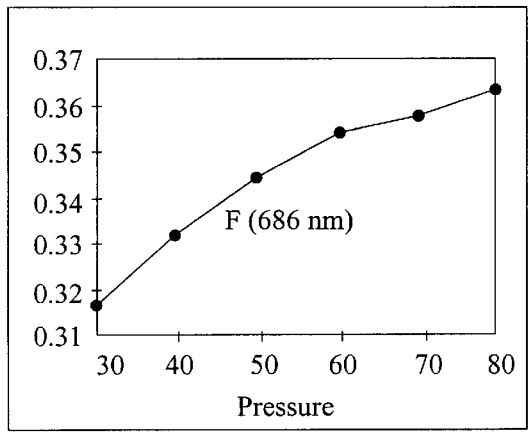
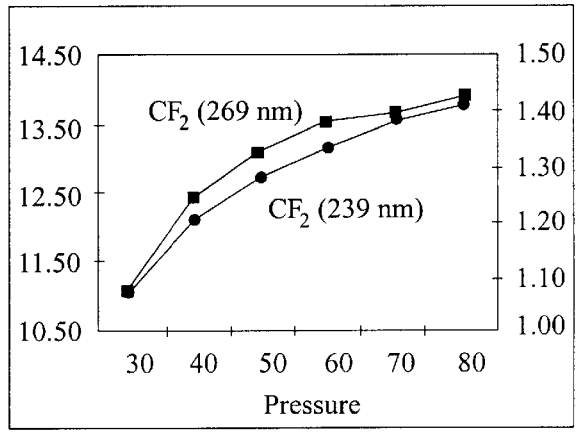
Figure 2  Figure 3
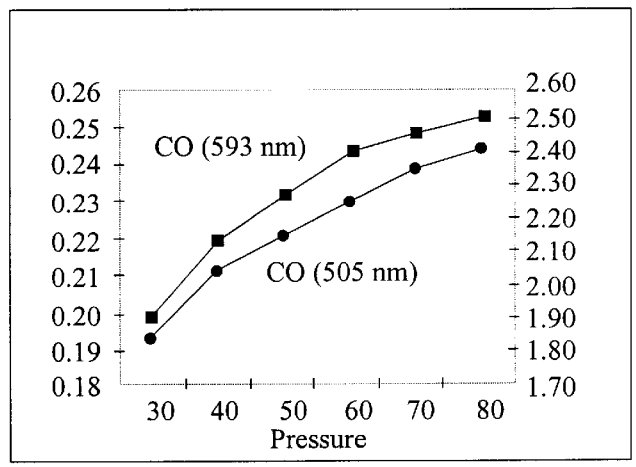
Figure 4

6,021,672

SIMULTANEOUS IN-SITU OPTICAL SENSING OF PRESSURE AND ETCH RATE IN PLASMA ETCH CHAMBER

FIELD OF THE INVENTION

The present invention relates to a plasma etch chamber method for use in the fabrication of semiconductor devices with improved monitoring of the inside chamber pressure and etching rate. More specifically, the present invention relates to an improved method for monitoring the inside pressure and/or etching rate inside a plasma etching chamber during the fabrication of semiconductor devices so as to improve the quality of the product, increase the production yield, and, consequently, reduce the manufacturing cost. One of the main characteristics of the method disclosed in the present invention is that it can be readily implemented in an existing plasma etch chamber without incurring substantially increased capital or modification cost.

BACKGROUND OF THE INVENTION

During the etching operation in the fabrication of semiconductor devices, the semiconductor wafer to be etched is placed in a plasma etching chamber, which is typically a semi-closed fabrication chamber with the continuous flow of one or more gaseous components therethrough via a vacuum pump. To facilitate the even distributions of the flowing gas, a baffle plate, or exhaust plate, is horizontally installed inside the etching chamber, dividing the fabrication chamber into an upper chamber and a lower chamber.

FIG. 1A shows an illustrative schematic cross-sectional view of a conventional plasma etching chamber. The chamber 11 is divided by a horizontally disposed baffle plate (or exhaust plate) 12 into an upper chamber 13 and a lower chamber 14. The fabrication chamber 11 also includes a cathode 15, a focusing ring 16, and an electrostatic chuck (ESC) 17 upon which a wafer 18 is disposed. The plasma etching chamber 11 is enclosed by a chamber wall 19.

FIG. 1A also shows that a turbo pump 22 and a throttle valve 23 are used to pump one or more gases into the fabrication chamber 11. FIG. 1B is a top view of a conventional baffle plate 12. Typically, the baffle plate 12 is a ring-shaped plate having a plurality of radially extending perforations 24. The baffle plate 12 is typically separated from the cathode 15 by an insulating ring 21.

To control the pressure inside the fabrication chamber and the flow of gas into the chamber, a pressure sensor 25 is often installed. The pressure sensor 25 is connected to the throttle valve 23 via a CPU, not shown. Analog signals obtained from the pressure sensor 25 are converted into digital signals by a D/A converter, which are then compared against a predetermined value stored in the CPU. The CPU then sends control signals to the throttle valve so that appropriate adjustments can be made to maintain the gas pressure inside the fabrication chamber at or close to the predetermined value.

Typically the pressure sensor 25 is a capacitance-type pressure sensor which comprises a thin membrane attached to a capacitance circuit. Once a pressure difference is present between the pressure chamber and the manometer, which typically has been calibrated at the factory, the sensitive thin membrane would move, causing the capacitance of the sensor circuit to change accordingly. The tiny change in the circuit capacitance is then converted to pressure readings.

Due to the sensitive electronics used in the pressure sensor, the pressure sensor is usually placed away from the etching chamber, as shown in FIG. 1A. If it is placed inside or near the plasma chamber, the sensing electronic circuit would be easily subject to electrical interference when the plasma discharge is turned on. In the worst case, the sensor may suffer permanent damages. On the other hand, even if perfect grounding and shielding can be provided to prevent damages, interference from charged particles (i.e., ions and electrons) contained in the plasma is inevitable and can cause serious signal stability problems.

Due to concerns over plasma attacks and electronic interferences, the pressure sensor is, as shown in FIG. 1A, placed away from the center of the etching process chamber and usually close to the pump and is separated from the etching chamber by the baffle plate. The main function of the baffle plate is to prevent polymer molecules and other unwanted process by-products, which are generated during the plasma etching process, from entering the pump. These foreign particles can noticeably degrade the quality and even substantially reduce the service life of the expensive pump.

It has been discovered that, after repeated usage of the plasma etching chamber, appreciable amounts of polymer deposits will accumulate on the surface of the baffle plate. With time, at least some the slit holes of the baffle plates will be clogged with the polymer deposits. This creates a restriction to the flow of the etching gas to the vacuum pump. As a result, a pressure difference will exist between the inside and outside of the etching chamber, and the pressure sensor placed outside of the etching chamber will no longer be able to reliably provide the actual pressure reading inside the etching chamber. Depending on the condition of the etching chamber, a pressure discrepancy of about 20 m Torr may be expected at a base pressure of about 40 to 70 m Torr inside the etching chamber. Typically, the clogging problem is not detected until the etching chamber is opened and inspected. Normally, routine inspections may identify and solve most of the clogging problems. However, if certain conditions cause the etching process to proceed abnormally, the polymer deposition may become accelerated and the clogging problem may turn out to be more serious than one can expect.

U.S. Pat. No. 5,694,207 discloses a method for in-situ monitoring of the etch rate in an etching chamber by measure intensity values of radiations at wavelengths of 388.5 and 443.7 nm, and computing the quotient thereof. In order to further overcome the large noise relative to the measured emission intensity, the invention further suggests measuring radiation intensities at four wavelengths. The large noise implied in the '207 patent and the fact that pressure measurement must be based on a relatively invariant species seemed to rule out using optical means to measure the etching pressure.

In order to more accurately monitor the true pressure inside the etching chamber so as to provide more precise control of the etching condition, it is important to develop methods that will overcome the above-mentioned problems. Imprecise pressure control inside the etching chamber can adversely result in significant increases in the product rejection rate, thus, it is critically important that the above-mentioned problem be carefully studied at and that a suitable solution be developed so as to improve the product yield rate. As semiconductor devices are becoming more like a common commodity, the profit margin of fabricating semiconductor devices is constantly decreasing. As a result, it is important to look at every process parameter that may affect the failure or rejection rate of the fabricated products, so as to reduce production cost.

SUMMARY OF THE INVENTION

The primary object of the present invention is to develop an improved process for the fabrication of semiconductor devices which allows a more precise control of the etching chamber pressure. More specifically, the primary object of the present invention is to develop an improved method for more accurately monitoring the true pressure inside an etching chamber during the fabrication of semiconductor devices, so as to allow more precise etching process control to be achieved to improve production yields.

In the present invention, it was discovered that an in situ and non-intrusive method can be developed to accurately monitor the true pressure inside a plasma etching chamber in a very cost effective manner. More specifically, the inventor found that certain plasma species present during the plasma etching process emitted radiation of such a high intensity and character that they can be utilized to accurately tell the true pressure inside the etching chamber. Typically, the emission lines of plasma species would be greatly masked by the background noise so as not to render them of any practical use. Furthermore, the plasma species would be generated or consumed during the etching process, so would be their emission intensity.

However, in the present invention, the inventor found that by monitoring the emission lines of F, $CF_2$, and/or CO, a distinctive and direct relationship can be established between the etching chamber pressure and the intensity of the emission spectrum of any one of these species. As a result, the emission spectrum of any of these species alone, or in conjunction thereof, can be used as a probe to monitor the true pressure inside the plasma etching chamber. Theoretically, as the pressure increases, the mean free path between molecules becomes smaller. Thus, the collision frequency would increase resulting in a greater number of excited species being produced and a greater emission intensity. However, this theoretical condition must be balanced against the large noise as impliedly indicated in the prior art references, as well as against the fact that the plasma species are being generated or consumed and are not kept at a constant number. Both of these factors strongly discourage the possible use of optical intensity for pressure measurement under a complicated environment such as plasma etching of semiconductors. The successful observations that have been made in this invention are indeed unexpected.

If the plasma species F is to be used as the pressure measuring probe, the emission intensity can be measured at 686 nm, corresponding to a transition from $3_s{}^4P_3$ to $3p^4P_3$ of the fluorine atom. The optical emission intensity can be measured at either 269 or 239 nm, corresponding to the transitions from $A^1B_1(v'=0)$ to $X^1A_1(v''=0)$ and from $A^1B_1(v'=9)$ to $X^1A_1(v''=0)$, respectively, if the species $CF_2$ is used as the probe. If CO is to be used as the probe, the optical emission intensity can also be measured at either of two wavelengths, 693 or 505 nm, corresponding to the transitions from $d^3\Pi(v'=2)$ to $a^3\Pi(V''=2)$ and from $d^3\Pi(v'=7)$ to $a^3\Pi(V''=2)$, respectively.

BRIEF DESCRIPTION OF THE DRAWING

The present invention will be described in detail with reference to the drawing showing the preferred embodiment of the present invention, wherein:

FIG. 2 is a plot showing the measured emission intensity vs. pressure for plasma species F at 686 nm.

FIG. 3 shows two plots of the measured emission intensities vs. pressure for plasma species $CF_2$ at 269 and 239 nm, respectively.

FIG. 4 shows two plots of the measured emission intensities vs. pressure for plasma species CO at 693 and 505 nm, respectively.

DETAILED DESCRIPTION OF THE PREFERRED EMBODIMENT

In the present invention, it was found that by selecting an appropriate plasma species as a probe, an in-situ and non-intrusive method can be developed to accurately monitor the true pressure inside a plasma etching chamber. The present invention found that certain plasma species that are present during the plasma etching process emitted light of such a intensity and character that they can be utilized to accurately measure the true pressure inside the etching chamber. Optical emission spectroscopy has been suggested as a means to monitor etch rate for fluoride/SOG systems. However, because of the large noise and the fact that the plasma species does not remain constant in the etching process, prior art never taught or suggested that the same approach can be used for pressure measurement. The present invention was prompted by the large difference that has been observed between the true pressure inside the etching chamber and the pressure reading obtained from the pressure sensor separated from the etching chamber by a baffle plate due to accumulation of polymer deposits on the baffle plate, and the need for precise monitoring of the etching chamber pressure so as to provide proper control of the etching process and improve semiconductor production yield.

The inventor found that, by measuring the intensity of emission lines of F, $CF_2$, and/or CO, a distinctive and direct relationship can be established between the etching chamber pressure and the value of the measured emission intensity of any one of these species respectively. As a result, the emission spectrum of any of these species alone can be used as a probe to monitor the true pressure inside the plasma etching chamber. As the pressure increases, the mean free path between molecules becomes smaller, and the collision frequency would increase resulting in a greater number of excited species being produced and thus a greater emission intensity. However, as discussed earlier, due to the large noise as impliedly indicated in the prior art references, and the fact that the plasma species are being generated or consumed and are not kept at a constant number, the prior art references have at least impliedly discouraged the use of using optical intensity as a pressure measurement tool under complicated environment such as plasma etching of semiconductors.

Figure 1A:
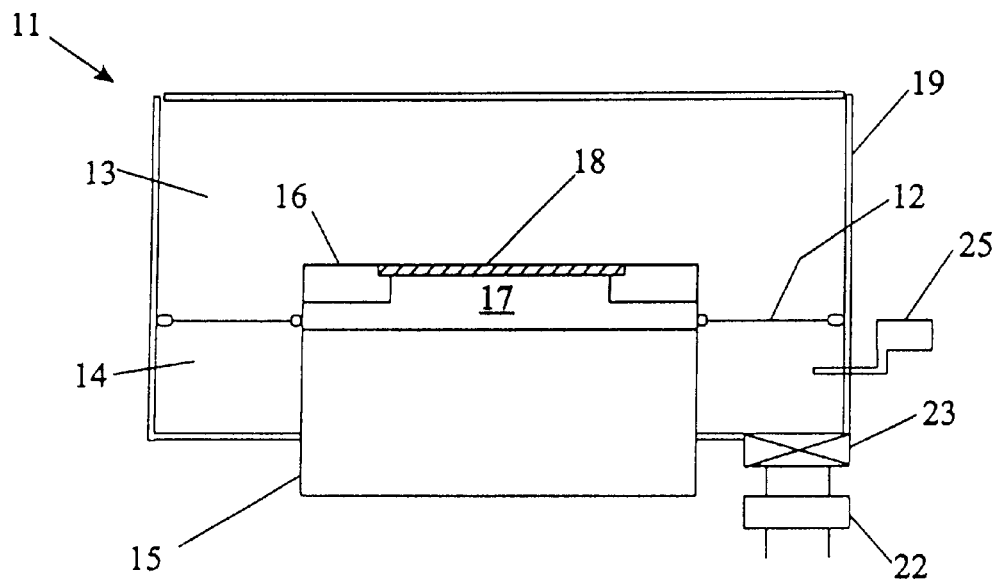
FIG. 1A is an illustrative schematic diagram showing a cross-sectional view of a conventional etching chamber.
Figure 1B:
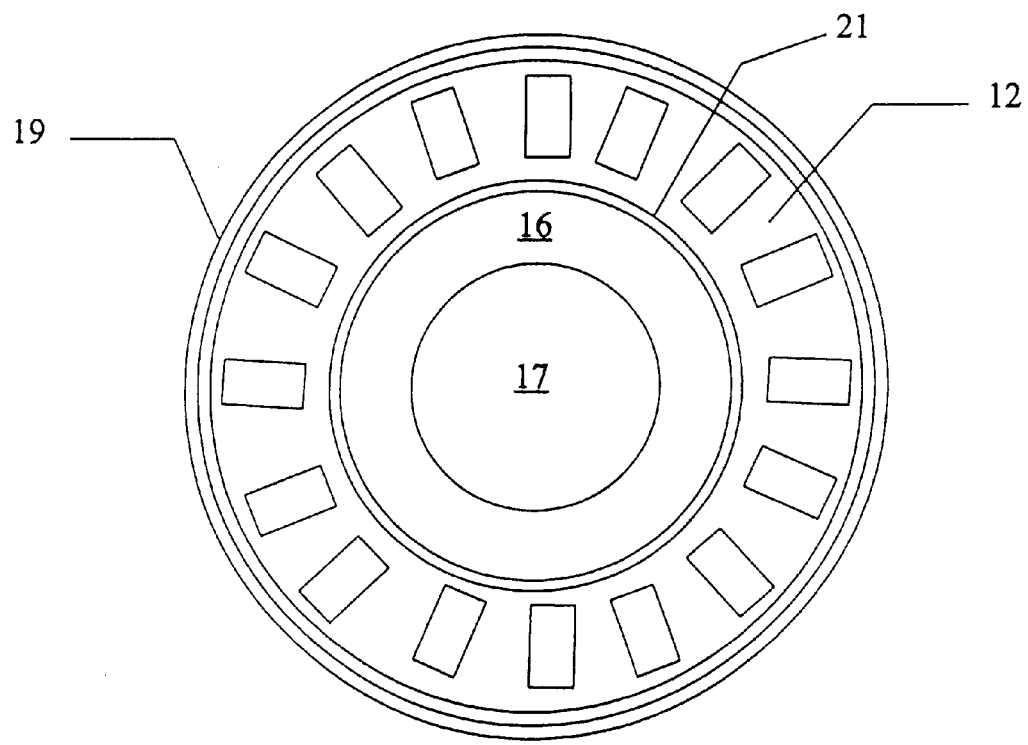
FIG. 1B is an illustrative schematic diagram showing a top view of the baffle plate.

FIG. 1A is an illustrative schematic diagram showing a cross-sectional view of a conventional etching chamber. FIG. 1B is an illustrative schematic diagram showing a top view of the baffle plate. As discussed earlier, accumulation of polymer deposits on the baffle plate can cause at least some of the slits to be clogged, resulting in a restriction to the flow of gas to the vacuum pump and thus an inaccurate reading of the etching chamber pressure by the pressure sensor placed outside the etching chamber.

If the species F is to be used as the pressure measuring probe, the emission intensity can be measured at 686 nm, corresponding to transition from $3s^4P_3$ to $3p^4$ $P_3$. FIG. 2 is a plot showing the measured emission intensity vs. pressure for plasma species F at 686 nm. Once a calibration curve is made, it can be used for subsequent pressure measurements. If the plasma species $CF_2$ is used as the probe, the optical emission intensity can be measured at either 269 or 239 nm, corresponding to the transitions from $A^1B_1(v'=0)$ to $X^1A_1$ (v"=0) and from $A^1B_1(v'=9)$ to $X^1A_1(v''=0)$, respectively. FIG. 3 shows two plots of the measured emission intensities vs. pressure for plasma species $CF_2$ at 269 and 239 nm, respectively.

If CO is to be used as the probe, the optical emission intensity can also be measured at either of two wavelengths, 693 or 505 nm, corresponding to the transitions from $d^3\Pi$ (v'=2) to $a^3\Pi(V''=2)$ and from $d^3\Pi(v'=7)$ to $a^3\Pi(V''=2)$, respectively. FIG. 4 shows two plots of the measured emission intensities vs. pressure for plasma species CO at 693 and 505 nm, respectively. Table 1 summarizes the wavelengths and the corresponding transitions of the plasma species employed in the present invention.

TABLE 1

| Plasma Species | Wavelength (nm) | Corresponding Transition |
|---|---|---|
| F | 686 | $3s^4P_3 \rightarrow 3p^4P_3$ |
| $CF_2$ | 269 | $A^1B_1$ (v' = 0) $\rightarrow$ $X^1A_1$ (v" = 0) |
|  | 239 | $A^1B_1$ (v' = 9) $\rightarrow$ $X^1A_1$ (v" = 0) |
| CO | 693 | $d^3\Pi$ (v' = 2) $\rightarrow$ $a^3\Pi$ (v" = 2) |
|  | 505 | $d^3\Pi$ (v' = 7) $\rightarrow$ $a^3\Pi$ (v" = 2) |

Figure 5:
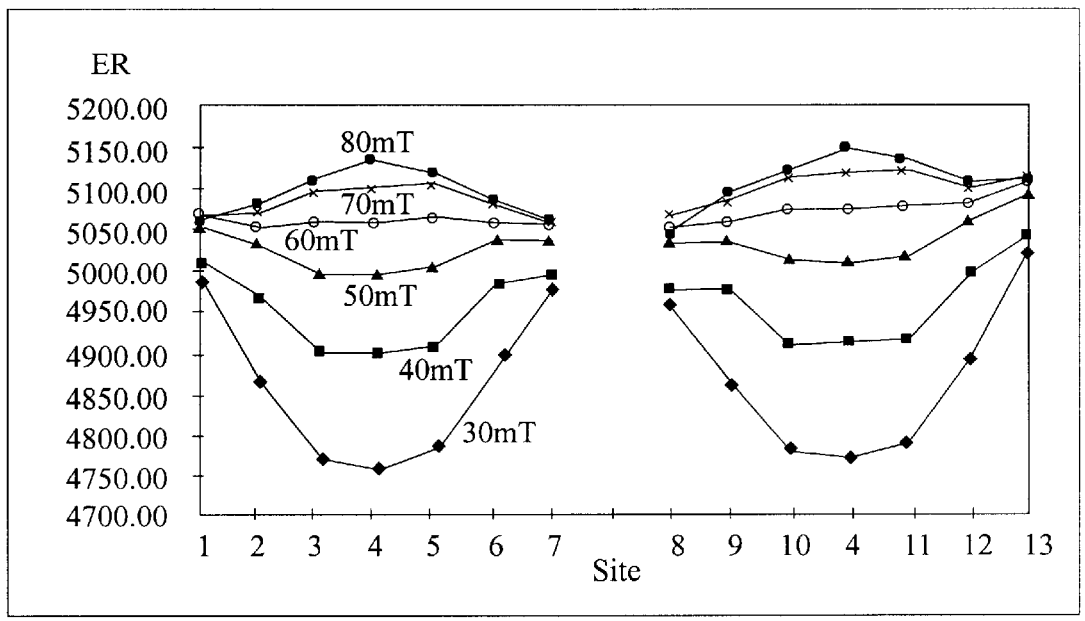
FIG. 5 shows plots of etch rate vs. pressure at various sites of the etching chamber.
Figure 6:
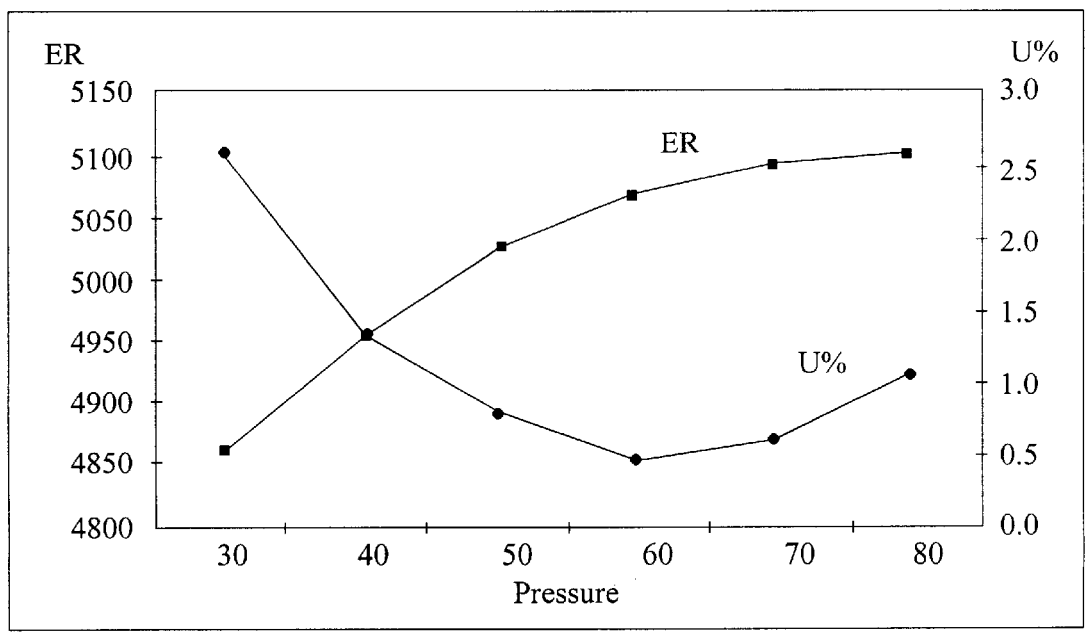
FIG. 6 shows plots of etch rate and uniformity vs. pressure.

In certain etching operations, a direct relationship that may also be found between the etch rate and etching pressure. In these conditions, the method disclosed in the present invention can also be used to measure etch rate. FIG. 5 shows plots of etch rate vs. pressure at various sites of the etching chamber. Since etch rate can vary from site to site, by properly selecting the plasma species and the optimal spot, a representative etch rate can be obtained using the same non-intrusive and in-situ technique developed in the present invention. Calibrations similar to FIG. 6, which shows plots of etch rate and uniformity vs. pressure, can be consulted with when selecting the optimal condition for using the method of the present invention to measure etching rate.

Figure 7:
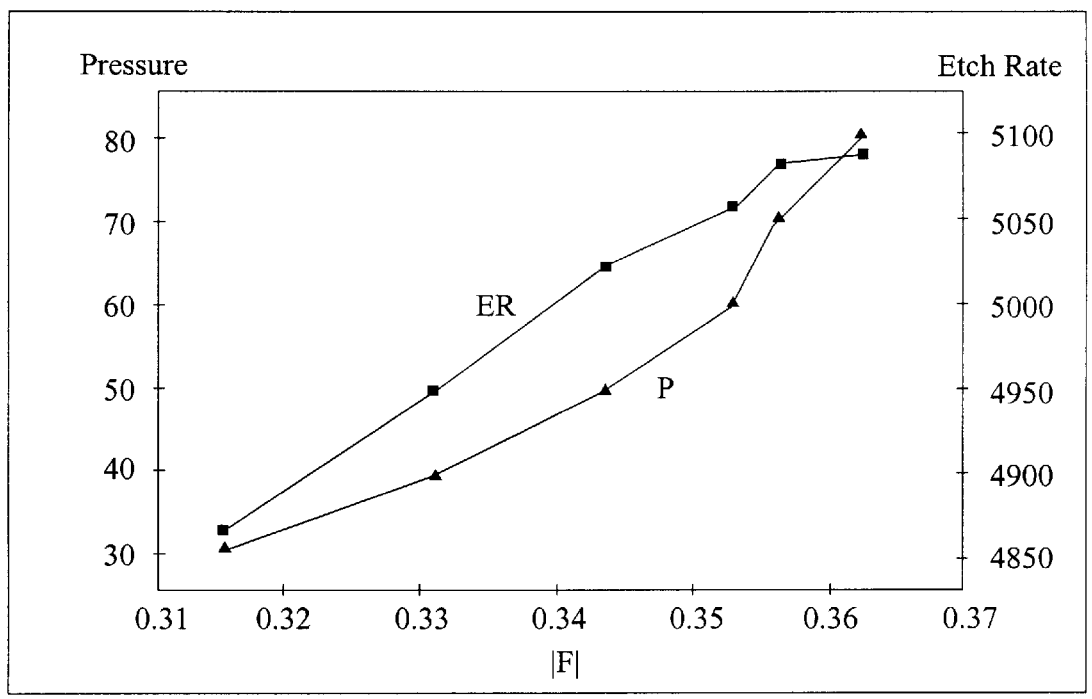
FIG. 7 shows plots of etch rate and pressure vs. the measured intensity of species F.

FIG. 7 shows plots of etch rate and pressure vs. the measured intensity of species F. With the method disclosed in the present invention, both etch rate and etching chamber pressure can be obtained simultaneously.

Figure 8:
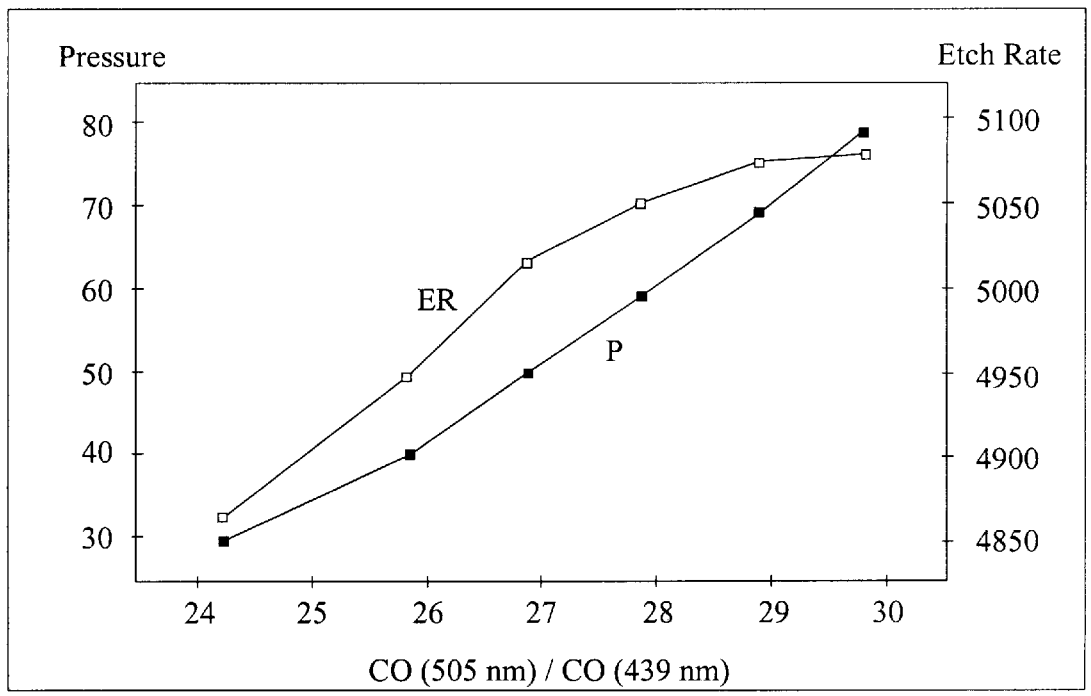
FIG. 8 shows plots of etch rate and pressure vs. the ratio of measured intensities of species CO at 505 nm and 639 nm.

Furthermore, while one of the main advantages of the present invention is that only the optical intensity of one plasma species needs to be measured, the present invention also allows pressure and etch rate readings to be obtained from intensity ratio. FIG. 8 shows plots of etch rate and pressure vs. ratio of measured intensities of species CO at 505 nm and 639 nm. However, the use of intensity ratios is only optional, and is not required in the present invention.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for measuring pressure inside a plasma etching chamber during the fabrication of semiconductor devices, comprising the steps of:
   (a) providing a gaseous plasma in said plasma etching chamber, wherein said gaseous plasma contains at least one plasma species selected from the group consisting of F, $CF_2$, and CO;
   (b) measuring an emission intensity of at least one of said plasma species at a predetermined wavelength associated with one of said plasma species; and
   (c) converting the measured emission intensity to etching chamber pressure.

2. The method for measuring pressure inside a plasma etching chamber according to claim 1 wherein said plasma species is F and said emission intensity is measured at a wavelength of 686 nm.

3. The method for measuring pressure inside a plasma etching chamber according to claim 1 wherein said plasma species is $CF_2$, and said emission intensity is measured at a wavelength of either 269 nm or 239 nm.

4. The method for measuring pressure inside a plasma etching chamber according to claim 1 wherein said plasma species is CO, and said emission intensity is measured at a wavelength of either 693 nm or 505 nm.

5. The method for measuring pressure inside a plasma etching chamber according to claim 1 wherein said etching chamber pressure is obtained by using a calibrated curve of etching pressure vs. emission intensity.

6. The method for measuring pressure inside a plasma etching chamber according to claim 1 wherein said plasma etching chamber contains a baffle plate separating said plasma etching chamber from a vacuum pump.

7. The method for measuring pressure inside a plasma etching chamber according to claim 1 wherein emission intensities at two or more of said predetermined wavelengths are measured and said etching chamber pressure is obtained based on a ratio of said emission intensities at said predetermined wavelengths.

8. The method for measuring pressure inside a plasma etching chamber according to claim 7 wherein said two or more of said predetermined wavelengths are associated with the same plasma species.

9. The method for measuring pressure inside a plasma etching chamber according to claim 8 wherein said plasma species is CO and said predetermined wavelengths are at 505 nm and 639 nm.

10. A method for simultaneously measuring etching pressure and etch rate inside a plasma etching chamber during the fabrication of semiconductor devices, comprising the steps of:
    (a) providing a gaseous plasma in said plasma etching chamber, wherein said gaseous plasma contains at least one plasma species selected from the group consisting of F, $CF_2$, and CO;
    (b) measuring an emission intensity of at least one of said plasma species at a predetermined wavelength associated with one of said plasma species; and
    (c) converting the measured emission intensity to etching chamber pressure.

11. The method for measuring pressure inside a plasma etching chamber according to claim 10 wherein said plasma species is F and said emission intensity is measured at a wavelength of 686 nm.

12. The method for measuring pressure inside a plasma etching chamber according to claim 10 wherein said plasma species is $CF_2$, and said emission intensity is measured at a wavelength of either 269 nm or 239 nm.

13. The method for measuring pressure inside a plasma etching chamber according to claim 10 wherein said plasma species is CO, and said emission intensity is measured at a wavelength of either 693 nm or 505 nm.

14. The method for measuring pressure inside a plasma etching chamber according to claim 10 wherein said etching chamber pressure is obtained by using a calibrated curve of etching pressure vs. emission intensity.

15. The method for measuring pressure inside a plasma etching chamber according to claim 10 wherein said plasma etching chamber contains a baffle plate separating said plasma etching chamber from a vacuum pump.

16. The method for measuring pressure inside a plasma etching chamber according to claim 10 wherein emission intensities at two or more of said predetermined wavelengths are measured and said etching chamber pressure is obtained based on a ratio of said emission intensities at said predetermined wavelengths.

17. The method for measuring pressure inside a plasma etching chamber according to claim 16 wherein said two or more of said predetermined wavelengths are associated with the same plasma species.

18. The method for measuring pressure inside a plasma etching chamber according to claim 17 wherein said plasma species is CO and said predetermined wavelengths are at 505 nm and 639 nm.

* * * * *